(12) United States Patent
Lee et al.

(10) Patent No.: US 8,402,349 B2
(45) Date of Patent: Mar. 19, 2013

(54) TWO DIMENSIONAL DATA RANDOMIZATION FOR A MEMORY

(75) Inventors: Douglas C. Lee, Cupertino, CA (US); Diarmuid P. Ross, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 239 days.

(21) Appl. No.: 12/961,272

(22) Filed: Dec. 6, 2010

(65) Prior Publication Data

US 2012/0144277 A1 Jun. 7, 2012

(51) Int. Cl.
*G06F 11/00* (2006.01)
(52) U.S. Cl. ........................................ 714/773
(58) Field of Classification Search .................. 714/773
See application file for complete search history.

(56) References Cited

U.S. PATENT DOCUMENTS

| 6,819,671 B1 | 11/2004 | Chen et al. |
| 2008/0151618 A1 | 6/2008 | Sharon et al. |
| 2010/0070681 A1 | 3/2010 | Wan et al. |

*Primary Examiner* — Bryce Bonzo
(74) *Attorney, Agent, or Firm* — Lawrence J. Merkel; Meyertons, Hood, Kivlin, Kowert & Goetzel, P.C.

(57) ABSTRACT

In an embodiment, a data scramble/descramble circuit for a memory may employ multiple scramble circuits that may provide randomization of data across both rows and columns of a memory array. The first circuit may receive at least a portion of the address of the row, and may produce an output value by logically operating on the portion of the address. The second circuit may receive the output of the first circuit (or a portion thereof) as a seed, and may scramble the data to be written to memory. In one embodiment, a least significant portion of the address may be operated upon by the first circuit (e.g. the least significant byte), which may be most likely to change from row to row as compared to other portions of the address.

22 Claims, 4 Drawing Sheets

TWO DIMENSIONAL DATA RANDOMIZATION FOR A MEMORY

BACKGROUND

1. Field of the Invention

This invention is related to memories in digital systems and, more particularly, to data randomization/scrambling mechanisms for memories.

2. Description of the Related Art

Certain memories used in digital systems can experience data loss if too many physically-proximate data bits in the memory have the same bit value and surround a bit of the opposite value. That is, if too many bits in physical proximity are zeros, data loss can occur for a one near the zeros. Similarly, if too many bits in physical proximity are ones, data loss can occur for a zero near the ones. More particularly, certain nonvolatile memories such as flash memories are subject to time decay in the electrical charge that represents each bit. As the charge decays, the data bit eventually cannot be reliably read (e.g. the probability of reading the same bit value that was previously written decreases). The rate of decay can increase in the memories if many nearby bits have the opposite value of the bit. To retain the data for a specified period of time, the rate of decay needs to be controlled. Accordingly, such memories specify a maximum number of nearby bits that can have the same value, as well as a lifetime for the data assuming that the maximum number is not exceeded.

On the other hand, the data to be stored in the memory may actually have significant clustering of the same bit value. For example, some data may tend to have many more zero bits than one bits, or vice versa. In order to meet the required mix of zeros and ones, controllers for the memory typically implement data randomization, or data scrambling. The data randomization/scrambling mechanisms use reproducible pseudo-random modifications to change the data written to memory, and to change the data back to the original data when read from the memory. By changing the data, the mix of ones and zeros is changed in an attempt to meet the specifications.

Data scrambling is applied to each row of data, seeding the pseudo-random circuitry with the address of the row. Such mechanisms result in reasonable randomization of the data in a given row. However, nearby rows are seeded with addresses that are nearly the same, and thus often receive similar randomization. Accordingly, the data along a column is not randomized very well, and thus data loss can be accelerated due to too many consecutive data bits in a column having the same value.

SUMMARY

In an embodiment, a data scramble circuit for a memory may employ multiple scramble circuits that may provide randomization of data across both rows and columns of a memory array. The first circuit may receive at least a portion of the address of the row, and may produce an output value by logically operating on the portion of the address. The second circuit may receive the output of the first circuit (or a portion thereof) as a seed, and may scramble the data to be written to memory. In one embodiment, a least significant portion of the address may be operated upon by the first circuit (e.g. the least significant byte), which may be most likely to change from row to row as compared to other portions of the address. The multiple levels of scrambling may improve the amount of randomness in the column direction in the memory array, while the amount of randomness in the row direction may be maintained or even improved.

In one embodiment, the first circuit may include circuitry to perform a logic operation on the address to produce the output. For example, the first circuit may be a cyclical redundancy check (CRC) generator. The CRC generator may receive the address (or the least significant portion, for example) and perform a CRC generation on the address. In an embodiment, the CRC generated is wider than the seed, and a portion may be used as the seed. The second circuit may be a pseudo-random number generator configured to generate a series of pseudo-random numbers based on the seed. For example, a linear feedback shift register (LFSR) may be used. The pseudo-random number may be logically combined with the data (e.g. exclusive-ORed (XORed)), and the pseudo-random number generator may be advanced to the next value after being used. Thus, the randomization of a given row (also referred to as a page) may be reproducible since the same seed would be generated for the page each time the page is opened.

BRIEF DESCRIPTION OF THE DRAWINGS

The following detailed description makes reference to the accompanying drawings, which are now briefly described.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Figure 1:
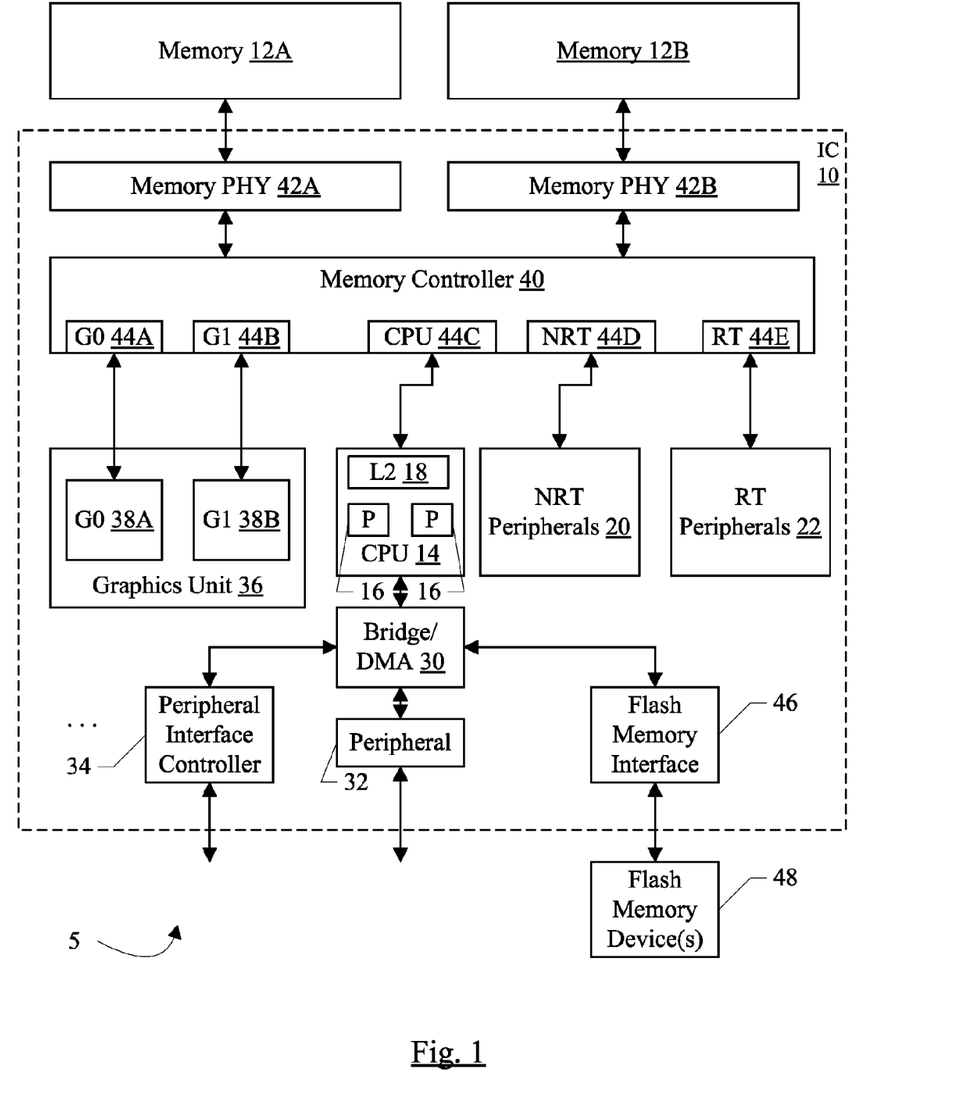
FIG. 1 is a block diagram of one embodiment of a system.

Turning now to FIG. 1, a block diagram of one embodiment of a system 5 is shown. In the embodiment of FIG. 1, the system 5 includes an integrated circuit (IC) 10 coupled to external memories 12A-12B and one or more external flash memory devices 48. In the illustrated embodiment, the integrated circuit 10 includes a central processor unit (CPU) block 14 which includes one or more processors 16 and a level 2 (L2) cache 18. Other embodiments may not include L2 cache 18 and/or may include additional levels of cache. Additionally, embodiments that include more than two processors 16 and that include only one processor 16 are contemplated. The integrated circuit 10 further includes a set of one or more non-real time (NRT) peripherals 20 and a set of one or more real time (RT) peripherals 22. In the illustrated embodiment, the CPU block 14 is coupled to a bridge/direct memory access (DMA) controller 30, which may be coupled to one or more peripheral devices 32 and/or one or more peripheral interface controllers 34. The number of peripheral devices 32 and peripheral interface controllers 34 may vary from zero to any desired number in various embodiments. One example of a peripheral device/interface controller is the flash memory interface unit 46, coupled to the bridge/DMA unit 30 and the flash memory devices 48. The system 5 illustrated in FIG. 1 further includes a graphics unit 36 comprising one or more graphics controllers such as G0 38A and G1 38B. The number of graphics controllers per graphics unit and the number of graphics units may vary in other embodiments. As illustrated in FIG. 1, the system 5 includes a memory controller 40 coupled to one or more memory physical interface circuits (PHYs) 42A-42B. The memory PHYs 42A-42B are configured to communicate on pins of the integrated circuit 10 to the memories 12A-12B. The memory controller 40 also includes a set of ports 44A-44E. The ports 44A-44B are coupled to the graphics controllers 38A-38B, respectively. The CPU block 14 is coupled to the port 44C. The NRT peripherals 20 and the RT peripherals 22 are coupled to the ports 44D-44E, respectively. The number of ports included in a memory controller 40 may be varied in other embodiments, as may the number of memory controllers. The number of memory PHYs 42A-42B and corresponding memories 12A-12B may be one or more than two in other embodiments.

The flash memory interface unit 46 may include circuitry configured to receive read and write memory operations for the flash memory devices 48, and configured to interface to the flash memory devices 48 to complete the read/write operations. In one embodiment, the read/write requests may be sourced from the bridge/DMA controller 30. The flash memory interface unit 46 may be programmable via one or more control registers (see FIG. 2 described below) to perform memory transfers to/from the flash memory devices 48. For example, the control registers may be programmable via programmed input/output (PIO) operations from the processors 16 or other processors in the system 5. The PIO operations may pass through the bridge/DMA controller 30 to the flash memory interface unit 46. Flash memory devices 40 may be flash memory, a type of non-volatile memory that is known in the art. In other embodiments, other forms of non-volatile memory may be used. For example, various types of programmable ROMs such as electrically-erasable programmable ROMs (EEPROMs), etc. may be used.

The flash memory interface unit 46 may implement the data scramble unit mentioned previously. That is, the flash memory interface unit 46 may include a data scramble unit that includes a first circuit and a second circuit. The first circuit may be configured to operate on at least a portion of the address of the memory operation, producing an output value that may be used as a seed to the second circuit. The second circuit may be configured to generate pseudo-random numbers that may be used to scramble the data to be written to memory, or descramble the data that is read from memory.

In one embodiment, the first circuit may be a cyclical redundancy check (CRC) generator. The CRC generator may receive the address (or the least significant portion, for example) and perform a CRC generation. The second circuit may be a pseudo-random number generator configured to generate a series of pseudo-random numbers based on the seed. For example, a linear feedback shift register (LFSR) may be used. The pseudo-random number may be logically combined with the data (e.g. exclusive-ORed (XORed)), and the pseudo-random number generator may be advanced to the next value after being used.

The flash memory interface unit 46 may be programmed via PIO operations to perform memory transfers to/from the flash memory devices 48. For write operations, the bridge/DMA controller 30 may DMA the write data to the flash memory interface unit 46. For read operations, the bridge/DMA controller 30 may DMA the read data from the flash memory interface unit 46. In an embodiment, the flash memory devices 46 may support a page of data transfer to/from the devices. The size of the page is device-dependent, and may not be the same as the page size used for virtual-to-physical address translation for the memory 12. For example, page sizes of 512 bytes, 2048 bytes, and 4096 bytes are often used.

Returning to the memory controller 40, generally a port may be a communication point on the memory controller 40 to communicate with one or more sources. In some cases, the port may be dedicated to a source (e.g. the ports 44A-44B may be dedicated to the graphics controllers 38A-38B, respectively). In other cases, the port may be shared among multiple sources (e.g. the processors 16 may share the CPU port 44C, the NRT peripherals 20 may share the NRT port 44D, and the RT peripherals 22 such as the display pipes 26 and the image processor 24 may share the RT port 44E. Each port 44A-44E is coupled to an interface to communicate with its respective agent. The interface may be any type of communication medium (e.g. a bus, a point-to-point interconnect, etc.) and may implement any protocol. In some embodiments, the ports 44A-44E may all implement the same interface and protocol. In other embodiments, different ports may implement different interfaces and/or protocols. In still other embodiments, the memory controller 40 may be single ported.

In an embodiment, each source may assign a quality of service (QoS) parameter to each memory operation transmitted by that source. The QoS parameter may identify a requested level of service for the memory operation. Memory operations with QoS parameter values requesting higher levels of service may be given preference over memory operations requesting lower levels of service. The memory controller 40 may be configured to process the QoS parameters received on each port 44A-44E and may use the relative QoS parameter values to schedule memory operations received on the ports with respect to other memory operations from that port and with respect to other memory operations received on other ports. In some embodiments, the memory controller 40 may be configured to upgrade QoS levels for pending memory operations. Various upgrade mechanism may be supported. For example, the memory controller 40 may be configured to upgrade the QoS level for pending memory operations of a flow responsive to receiving another memory operation from the same flow that has a QoS parameter specifying a higher QoS level. This form of QoS upgrade may be referred to as in-band upgrade, since the QoS parameters transmitted using the normal memory operation transmission method also serve as an implicit upgrade request for memory operations in the same flow. The memory controller 40 may be configured to push pending memory operations from the same port or source, but not the same flow, as a newly received memory operation specifying a higher QoS level. As another example, the memory controller 40 may be configured to couple to a sideband interface from one or more agents, and may upgrade QoS levels responsive to receiving an upgrade request on the sideband interface. In another example, the memory controller 40 may be configured to track the relative age of the pending memory operations. The memory controller 40 may be configured to upgrade the QoS level of aged memory operations at certain ages. The ages at which upgrade occurs may depend on the current QoS parameter of the aged memory operation.

The memory controller 40 may be configured to determine the memory channel addressed by each memory operation received on the ports, and may be configured to transmit the memory operations to the memory 12A-12B on the corresponding channel. The number of channels and the mapping of addresses to channels may vary in various embodiments and may be programmable in the memory controller. The memory controller may use the QoS parameters of the memory operations mapped to the same channel to determine an order of memory operations transmitted into the channel.

The processors 16 may implement any instruction set architecture, and may be configured to execute instructions defined in that instruction set architecture. The processors 16 may employ any microarchitecture, including scalar, superscalar, pipelined, superpipelined, out of order, in order, speculative, non-speculative, etc., or combinations thereof. The processors 16 may include circuitry, and optionally may implement microcoding techniques. The processors 16 may include one or more level 1 caches, and thus the cache 18 is an L2 cache. Other embodiments may include multiple levels of caches in the processors 16, and the cache 18 may be the next level down in the hierarchy. The cache 18 may employ any size and any configuration (set associative, direct mapped, etc.).

The graphics controllers 38A-38B may be any graphics processing circuitry. Generally, the graphics controllers 38A-38B may be configured to render objects to be displayed into a frame buffer. The graphics controllers 38A-38B may include graphics processors that may execute graphics software to perform a part or all of the graphics operation, and/or hardware acceleration of certain graphics operations. The amount of hardware acceleration and software implementation may vary from embodiment to embodiment.

The NRT peripherals 20 may include any non-real time peripherals that, for performance and/or bandwidth reasons, are provided independent access to the memory 12A-12B. That is, access by the NRT peripherals 20 is independent of the CPU block 14, and may proceed in parallel with CPU block memory operations. Other peripherals such as the peripheral 32 and/or peripherals coupled to a peripheral interface controlled by the peripheral interface controller 34 may also be non-real time peripherals, but may not require independent access to memory. Various embodiments of the NRT peripherals 20 may include video encoders and decoders, scaler/rotator circuitry, image compression/decompression circuitry, etc.

The RT peripherals 22 may include various peripherals that exhibit real-time characteristics. For example, the RT peripherals may include one or more image processors and one or more display pipes. The display pipes 26 may include circuitry to fetch one or more image frames and to blend the frames to create a display image. The display pipes may further include one or more video pipelines, and video frames may be blended with (relatively) static image frames to create frames for display at the video frame rate. The result of the display pipes may be a stream of pixels to be displayed on the display screen. The pixel values may be transmitted to a display controller for display on the display screen. The image processor may receive camera data and process the data to an image to be stored in memory.

The bridge/DMA controller 30 may comprise circuitry to bridge the peripheral(s) 32 and the peripheral interface controller(s) 34 to the memory space. In the illustrated embodiment, the bridge/DMA controller 30 may bridge the memory operations from the peripherals/peripheral interface controllers through the CPU block 14 to the memory controller 40. The CPU block 14 may also maintain coherence between the bridged memory operations and memory operations from the processors 16/L2 Cache 18. The L2 cache 18 may also arbitrate the bridged memory operations with memory operations from the processors 16 to be transmitted on the CPU interface to the CPU port 44C. The bridge/DMA controller 30 may also provide DMA operation on behalf of the peripherals 32 and the peripheral interface controllers 34 to transfer blocks of data to and from memory. More particularly, the DMA controller may be configured to perform transfers to and from the memory 12A-12B through the memory controller 40 on behalf of the peripherals 32 and the peripheral interface controllers 34. The DMA controller may be programmable by the processors 16 to perform the DMA operations. For example, the DMA controller may be programmable via descriptors. The descriptors may be data structures stored in the memory 12A-12B that describe DMA transfers (e.g. source and destination addresses, size, etc.). Alternatively, the DMA controller may be programmable via registers in the DMA controller (not shown).

The peripherals 32 may include any desired input/output devices or other hardware devices that are included on the integrated circuit 10. For example, the peripherals 32 may include networking peripherals such as one or more networking media access controllers (MAC) such as an Ethernet MAC or a wireless fidelity (WiFi) controller. An audio unit including various audio processing devices may be included in the peripherals 32. One or more digital signal processors may be included in the peripherals 32. The peripherals 32 may include any other desired functional such as timers, an on-chip secrets memory, an encryption engine, etc., or any combination thereof.

The peripheral interface controllers 34 may include any controllers for any type of peripheral interface. For example, the peripheral interface controllers may include various interface controllers such as a universal serial bus (USB) controller, a peripheral component interconnect express (PCIe) controller, general purpose input/output (I/O) pins, etc.

The memories 12A-12B may be any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with the integrated circuit 10 in a chip-on-chip configuration, a package-on-package configuration, or a multi-chip module configuration.

The memory PHYs 42A-42B may handle the low-level physical interface to the memory 12A-12B. For example, the memory PHYs 42A-42B may be responsible for the timing of the signals, for proper clocking to synchronous DRAM memory, etc. In one embodiment, the memory PHYs 42A-42B may be configured to lock to a clock supplied within the integrated circuit 10 and may be configured to generate a clock used by the memory 12.

It is noted that other embodiments may include other combinations of components, including subsets or supersets of the components shown in FIG. 1 and/or other components. While one instance of a given component may be shown in FIG. 1, other embodiments may include one or more instances of the given component. Similarly, throughout this detailed description, one or more instances of a given component may be included even if only one is shown, and/or embodiments that include only one instance may be used even if multiple instances are shown.

Figure 2:
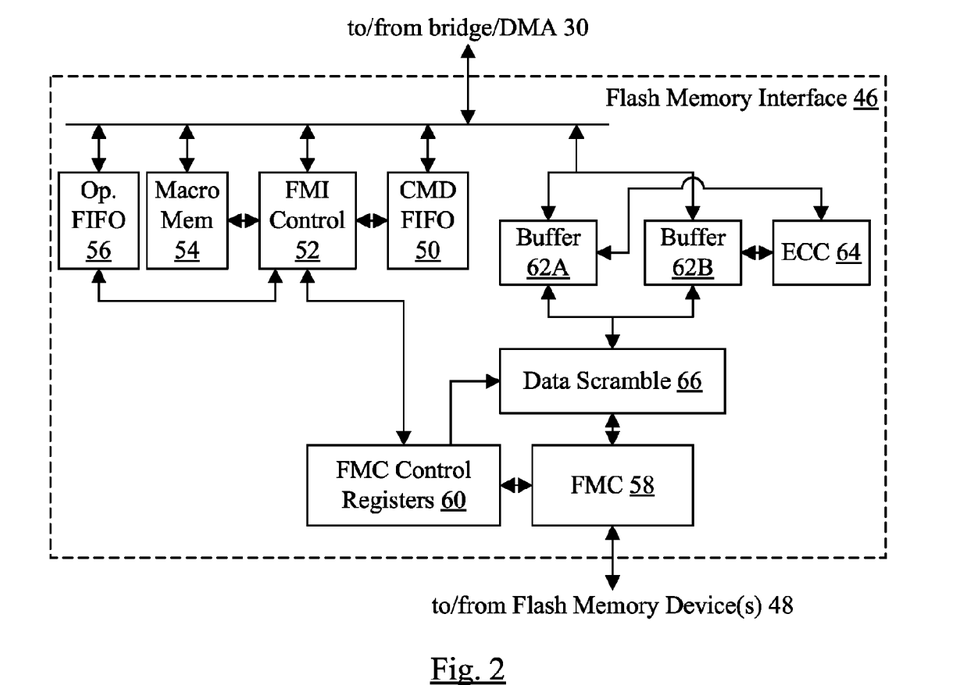
FIG. 2 is a block diagram of one embodiment of a flash memory interface unit shown in FIG. 1.

Turning now to FIG. 2, a block diagram of one embodiment of the flash memory interface unit 46 is shown. In the illustrated embodiment, the flash memory interface unit 46 includes a command FIFO 50, a flash memory interface (FMI) control circuit 52, a macro memory 54, an operand FIFO 56, a flash memory controller (FMC) 58, a set of FMC control registers 60, data buffers 62A-62B, an error checking/correction (ECC) unit 64, and a data scramble unit 66. The command FIFO 50, FMI control circuit 52, macro memory 54, operand FIFO 56, and buffers 62A-62B are all coupled to an internal interface to the bridge/DMA controller 30. The FMI control circuit 52 is further coupled to the command FIFO 50, the macro memory 54, the operand FIFO 56, and the FMC control registers 60. The FMC control registers 60 are further coupled to the FMC 58 and the data scramble unit 66. The FMC 58 is coupled to an external interface to the flash memory devices 48. The FMC 58 is further coupled to the data scramble unit 66, which is further coupled to the buffers 62A-62B. The ECC unit 64 is also coupled to the buffers 62A-62B.

The FMC control registers 60 may be programmed with commands to open a page of one of the flash memory devices 48, and to transfer data into or out of the page. The commands include the address of the page, at least a portion of which may be received by the data scramble unit 66. In the illustrated embodiment, the commands may be written to the command FIFO 50 and performed by the FMI control circuit 52. In other embodiments, the commands may be written directly to the registers 60 or the commands may be received by the FMC 58 directly. In still other embodiments, a combination of direct commands and commands in the registers 60 may be used.

The data scramble unit 66 may be configured to operate on the received address and to seed the pseudo-random number generator, which may be configured to generate a series of pseudo-random numbers beginning with the seed. The data scramble unit 66 may be configured to logically combine the pseudo-random numbers with the data to scramble the data on a write operation (e.g. by XORing the data and the pseudo-random number). On a read operation, the data scramble has the effect of descrambling, since the data read from the flash memory 48 was scrambled prior to writing the data.

Generally, data scrambling may refer to any deterministic, reversible modification of the data. The data scrambling may be designed to increase the variation in the data, reducing the number of consecutive zeros or consecutive ones in the data, on average. Data scrambling may also be referred to as data randomization. In this context, randomization may be pseudo-random, because the randomization/scrambling is reproducible so that the original data can be recovered. A series of pseudo-random numbers, for example, may appear to be random (there may be large and varied distances between consecutive numbers, the repeat rate in the numbers may be low, etc.). However, the series is deterministic and, given the same seed, the same series pseudo-random numbers are generated in the same order.

The FMI control circuit 52 may be configured to receive PIO operations from the bridge/DMA controller 30. Some PIO operations may be directed to the command FIFO 50, the macro memory 54, or the operand FIFO 56. For example, PIO writes may be used to write commands into the command FIFO 50, to download macros into the macro memory 54, or to write operands into the operand FIFO 56. Addresses may be assigned to each of the FIFO 50, the macro memory 54, and the operand FIFO 56, which may be used in the PIO operands to address the desired resource. For example, the FIFOs 50 and 56 may have a single assigned address since they may operate in a first-in, first-out manner. A PIO write to the address may cause the FMI control circuit 52 to store the data provided with the write in the next open entry in the FIFO 50 or 56. That is, the data may be appended to the tail of the FIFO 50 or 56, where commands or operands are removed from the head of the FIFO 50 or 56. The macro memory 54 may have a range of addresses assigned to it, e.g. an address per word of the macro memory 54. PIO writes to the addresses may store the provided data word into the addressed word of the macro memory 54.

The FMI control circuit 52 may process the commands in the command FIFO 50 to program various FMC control registers 60 to cause the FMC 58 to perform a particular memory transfer to/from the flash memory devices 48. In one embodiment, the FMC 58 is configured to receive relatively low-level control via the FMC control registers 60, including address, chip enables, transfer commands, etc. Commands in the command FIFO 50 may be interpreted by the FMI control circuit 52 and the corresponding FMC control registers 60 may be written by the FMI control circuit 52. Similarly, commands to wait for an event may be interpreted by the FMI control circuit 52 to read one or more FMC control registers 60 to detect the event. There may also be direct control signals between the FMI control circuit 52 to the FMC 58, in some embodiments (not shown in FIG. 2) which may be driven by the FMI control circuit 52 responsive to commands and/or monitored by the FMI control circuit 52 responsive to commands.

A macro command may be in the command FIFO 50, and the FMI control circuit 52 may perform commands from the macro memory 54 in response to the macro command. In other embodiments, the macro command may be transmitted as a PIO operation to the FMI control circuit 52. In still other embodiments, macro commands may be encountered in the command FIFO 50 or in PIO operations. The macro command may include a starting address in the macro memory and a word count indicating the number of words to read from the macro memory 54. The FMI control circuit 52 may perform the commands in the macro prior to reading the next command in the command FIFO 50. The words in the macro may include operands in addition to commands, in one embodiment. Other embodiments may use a command count rather than a word count. The macro command may also include a loop count and the macro may be iterated the number of times indicated by the loop count. Reading words from the command FIFO 40 and the operand FIFO 56 may include the FMI control circuit 52 deleting those words from the FIFO. Reading words from the macro memory 54, on the other hand, may not involve deleting the words so that macros may be repeatedly performed.

The FMC 58 may perform memory transfers in response to the contents of the FMC control registers 60, transmitting data read from the flash memory devices 48 to the data scramble unit 66, which may descramble the data and write the descrambled data to the buffers 62A-62B. Furthermore, the FMC may write data provided by the data scramble unit 66 (corresponding to data read from the buffers 62A-62B) to the flash memory devices 48. The buffers 62A-62B may be used in a ping-pong fashion, in which one of the buffers 62A-62B is being filled with data while the other is being drained. For example, reads from the flash memory devices 48 may include the filling one of the buffers 62A-62B while the other buffer 62A-62B is being drained by the bridge/DMA controller 30 performing DMA operations to memory 12. Writes to the flash memory devices 48 may include the bridge/DMA controller 30 filling one of the buffers 62A-62B with data while the FMC 58 drains the other buffer 62A-62B. The ECC unit 64 may generate ECC data for writes to the flash memory devices 48, and may check the ECC data for reads from the flash memory devices 48.

Commands in the command queue and/or commands in the macro memory may use operands to control their operation. In some cases, the operands may be stored in the command FIFO 50. In other cases, the operands may be stored in the operand FIFO 56. Commands in the command FIFO 50 or in the macro memory 54 may specify that the flash memory interface unit 46 load operands from the operand FIFO 56 and operate on the operands. The operand FIFO 56 may be used with a macro to supply instance-specific data for the generic macro (e.g. flash memory addresses, chip enables, etc.).

It is noted that, while the data scramble unit 66 is described in this embodiment for use in a flash memory interface unit, other memory interface units/memory controllers configured to interface to other memories may implement the data scramble unit 66.

Figure 3:
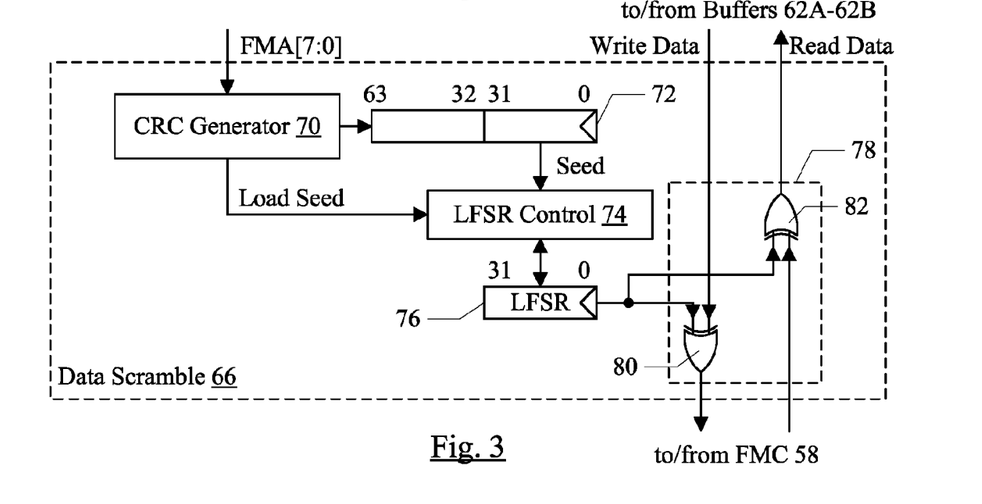
FIG. 3 is a block diagram of one embodiment of a data scramble unit shown in FIG. 2.

Turning now to FIG. 3, a block diagram of one embodiment of the data scramble unit 66 is shown. In the illustrated embodiment, the data scramble unit 66 includes a CRC generator 70, a CRC register 72, an LFSR control circuit 74, an LFSR register 76, and a circuit 78. Together, the LFSR control circuit 74 and the LFSR register 76 may form an LFSR. The CRC generator 70 may be coupled to receive a portion of the page address from the FMC control registers 60 (e.g. the least significant byte, FMA[7:0] in FIG. 3) and may be coupled to the CRC register 72 and the LFSR control circuit 74. The LFSR control circuit 74 may be further coupled to the LFSR register 76 and the CRC register 72. The LFSR register 76 may further be coupled to the circuit 78. The circuit 78 may comprise bitwise XOR circuitry, represented by the XOR gate 80 for write data and the XOR gate 82 for read data.

The CRC generator 70 may be configured to generate a CRC responsive to the received address, may be configured to store the generated CRC in the CRC register 72. In other embodiments, the CRC register 72 may not be used and the CRC generator 70 may output the generated CRC directly to the LFSR control circuit 74. In the illustrated embodiment, the CRC generator 70 may be configured to generate a 64 bit CRC, 32 bits of which are used as a seed for the LFSR. More generally, the generated CRC may be larger than the page address (which may be 32 bits in this embodiment) and/or larger than the width of the data transferred on the interface to the flash memory devices 48 (which may also be 32 bits in this embodiment). Other embodiments may employ different address/data widths and different CRC widths. Generally, the CRC width may be selected to be larger than the address/data width.

Employing a larger CRC width than the address, and using the least significant bits of the address, may provide more variation in the LFSR seed between consecutive addresses within the flash memory devices. Greater variation in the LFSR seed may create greater variation in the numbers generated by the LFSR, which may result in greater variation in the data that is written to consecutive rows with the flash memory. Data from consecutive rows may be physically near each other, and providing greater variation may improve the life of data in the consecutive rows in some embodiments.

The CRC generator 70 may be configured to form a larger input value to the CRC generation itself using the received address bits. For example, in an embodiment, multiple copies of the received address bits may be concatenated to form the input value. One or more of the copies may be inverted and concatenated. For example, an embodiment may use four copies of the input address byte to form a 32-bit CRC input value. Thus, the input value to the CRC generation may have a width that is an integer multiple of the width of the portion of the input address. In one particular embodiment, the second least significant byte of the CRC input may be an inverted copy of the input address byte, and other copies may not be inverted. That is, the input CRC value may be:

Input CRC[31:0]={FMA[7:0], FMA[7:0], ~FMA[7:0], FMA[7:0]}

Other embodiments may use other combinations of inverted and non-inverted copies, as desired. While the least significant byte of the page address is used in the present embodiment, other embodiments may use other portions of the address (e.g. the least significant two or three bytes, or non-byte-sized bit fields from the address). An inverted copy of a value may also be referred to as a complement of the value.

In one embodiment, the CRC generator 70 may implement CRC-64-ECMA-182. This CRC may be designed for large data sets, and may provide a low repeat rate. Other embodiments may implement any desired CRC. The polynomial for CRC-64-ECMA-182 is $x^{64}+x^{62}+x^{57}+x^{55}+x^{54}+x^{53}+x^{52}+x^{47}+x^{46}+x^{45}+x^{40}+x^{39}+x^{38}+x^{37}+x^{35}+x^{33}+x^{32}+x^{31}+x^{29}+x^{27}+x^{24}+x^{23}+x^{22}+x^{21}+x^{19}+x^{17}+x^{13}+x^{12}+x^{10}+x^{9}+x^{7}+x^{4}+x+1$. The CRC may be initialized as all one's, and then the CRC may be generated over the CRC input value.

The least significant bits of the generated CRC (e.g. the least significant 32 bits of the CRC, in this embodiment) may be used as the seed to the LFSR. The CRC generator 70 may generate the CRC, and may assert the load seed signal to the LFSR control circuit 74. The LFSR control circuit 74 may initialize the LFSR register 72 to the seed. Responsive to the seed, the LFSR may generate a series of pseudo-random numbers. More particularly, the seed may be used as the first pseudo-random number. As each pseudo-random number is consumed by the circuit 78, randomizing data to/from the page, the LFSR may generate the next number in the series.

Generally, the current value of the LFSR may be used to generate a bit that is shifted into the LFSR to create the next value. For example, the LFSR may be configured to right shift by one bit, shifting the newly generated bit into the least significant bit of the next value. The LFSR may, for example, be configured to generate the new bit as the XOR of the selected bits. Any mechanism may be used in various embodiments. For example, an embodiment may implement the following polynomial: $x^{32}+x^{24}+x^{21}+x^{6}+x^{2}+x^{1}+1$. Other embodiments may implement other polynomials. Generating the bit and shifting the register may generally be referred to as advancing the LFSR to the next value.

The circuit 78 may receive the LFSR value, and may be configured to bitwise XOR the LFSR value with the read or write data. In an embodiment, the LFSR value may be the same width as the width of one data transfer (or beat) to/from the flash memory devices (e.g. 32 bits in this embodiment). In other embodiments, the data interface may be wider than the LFSR value and the LFSR value may be concatenated with itself to create a wide enough value to be bitwise-combined with the data. Generally, any width of data transfer/beat may be used in various embodiments. Each data transfer/beat may be one cycle (e.g. one clock cycle, for single data rate memory, one half clock cycle, for double data rate, etc.) of data transfer. Thus, a page may be transferred as multiple data transfers/beats in this embodiment.

Since the same seed is generated for both a read and a write to the page, the same set of pseudo-random numbers may be generated as the page is read and as the page is written. Thus, the bitwise XOR of the read data with the pseudo-random numbers may unscramble the data that was scrambled to write the data to the flash memory devices, recovering the original data that was provided for storage in the flash memory device.

Figure 4:
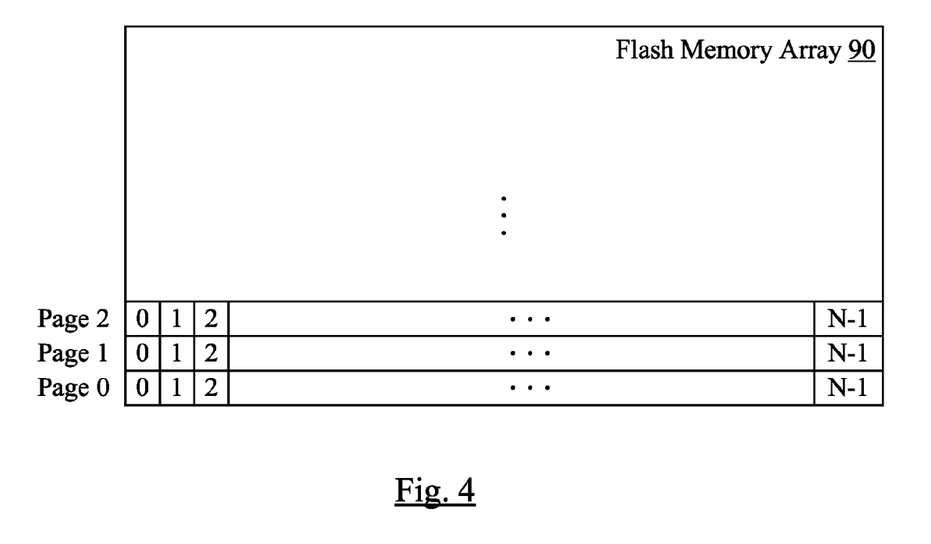
FIG. 4 is a block diagram illustrating one embodiment of a flash memory.

Turning now to FIG. 4, a block diagram of one embodiment of a flash memory array 90 is shown. The array 90 may include multiple rows, one for each page of the flash memory array. Each row may include N bits (bits 0 to N−1). The bits of adjacent rows in the array 90 may be located physically near other bits. Thus, for example, bit 1 of page 1 may be physically near bits 0 and 2 of page 1, and bits 0 to 2 of pages 0 and 2 as well. Using the mechanisms described above for data scrambling, good variation in bits of a column of the memory (e.g. bits in adjacent rows having the same bit number) may be achieved.

Figure 5:
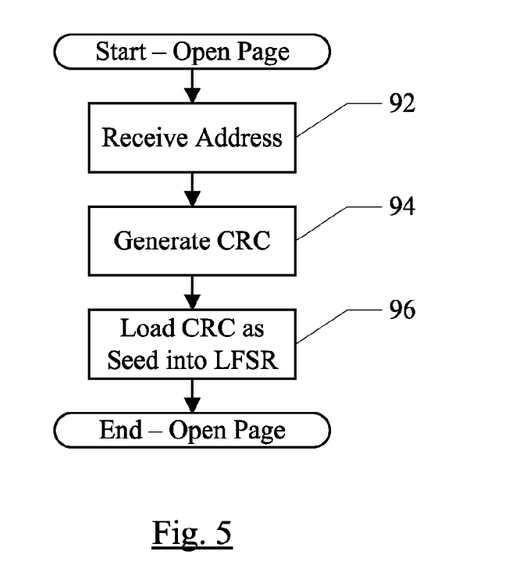
FIG. 5 is a flowchart illustrating operation of one embodiment of a flash memory interface unit to open a page.

FIG. 5 is a flowchart illustrating operation of one embodiment of the FMI unit 46, and more particularly the data scramble unit 66, is shown for an open page command. While the blocks are shown in a particular order in FIG. 5 for ease of understanding, other orders may be used. Blocks may be performed in parallel by combinatorial logic circuitry in the FMI unit 46/data scramble unit 66. Blocks, combinations of blocks, and/or the flowchart as a whole may be pipelined over multiple clock cycles. The FMI unit 46/data scramble unit 66 may be configured to implement the operation shown in FIG. 5. The open page command may be specified as a command in the control registers 60.

The data scramble unit 66 may receive the page address (or the portion thereof, such as the least significant byte in the embodiment of FIG. 3) (block 92). Responsive to the received address, the data scramble unit 66 may generate the CRC (block 94). The data scramble unit 66 may load the generated CRC (or the least significant portion, in the embodiment of FIG. 3) into the LFSR as the seed (block 96).

Figure 6:
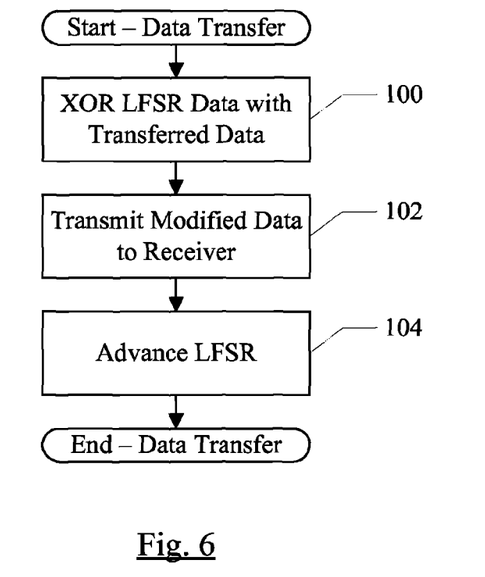
FIG. 6 is a flowchart illustrating operation of one embodiment of a flash memory interface unit to transfer data.

FIG. 6 is a flowchart illustrating operation of one embodiment of the FMI unit 46, and more particularly the data scramble unit 66, is shown for a data transfer to/from the flash memory devices. The transfer may be either a read or write, for data that is part of a page read or a page write operation. While the blocks are shown in a particular order in FIG. 6 for ease of understanding, other orders may be used. Blocks may be performed in parallel by combinatorial logic circuitry in the FMI unit 46/data scramble unit 66. Blocks, combinations of blocks, and/or the flowchart as a whole may be pipelined over multiple clock cycles. The FMI unit 46/data scramble unit 66 may be configured to implement the operation shown in FIG. 6. The data transfer command may be specified as a command in the control registers 60.

The data scramble unit 66 may XOR the LFSR data with the transferred data (block 100) and may transmit the resulting modified (scrambled) data to the receiver (block 102). The receiver may be a buffer 62A-62B for a read, or the FMC 58 (and ultimately the flash memory devices) for a write. The data scramble unit 66 may advance the LFSR to the next value (block 104).

Figure 7:
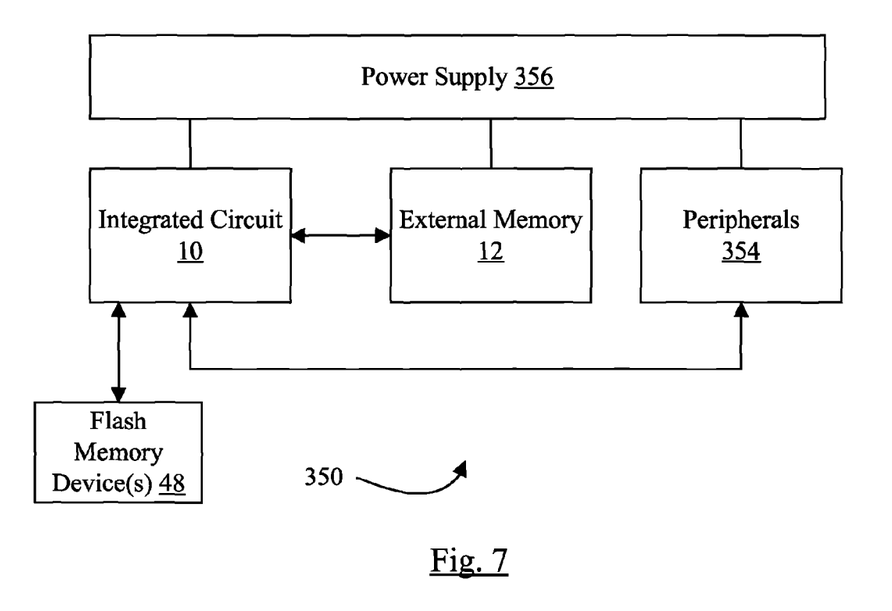
FIG. 7 is a block diagram of one embodiment of a system.

Turning next to FIG. 7, a block diagram of one embodiment of a system 350 is shown. In the illustrated embodiment, the system 350 includes at least one instance of the integrated circuit 10 coupled to external memory 12 (e.g. the memory 12A-12B in FIG. 1). The integrated circuit 10 is coupled to one or more peripherals 354 and the external memory 12. A power supply 356 is also provided which supplies the supply voltages to the integrated circuit 10 as well as one or more supply voltages to the memory 12 and/or the peripherals 354. In some embodiments, more than one instance of the integrated circuit 10 may be included (and more than one external memory 12 may be included as well). The flash memory devices 48 are also shown in the system 350, coupled to the IC 10.

The peripherals 354 may include any desired circuitry, depending on the type of system 350. For example, in one embodiment, the system 350 may be a mobile device (e.g. personal digital assistant (PDA), smart phone, etc.) and the peripherals 354 may include devices for various types of wireless communication, such as wifi, Bluetooth, cellular, global positioning system, etc. The peripherals 354 may also include additional storage, including RAM storage, solid state storage, or disk storage. The peripherals 354 may include user interface devices such as a display screen, including touch display screens or multitouch display screens, keyboard or other input devices, microphones, speakers, etc. In other embodiments, the system 350 may be any type of computing system (e.g. desktop personal computer, laptop, workstation, net top etc.).

Numerous variations and modifications will become apparent to those skilled in the art once the above disclosure is fully appreciated. It is intended that the following claims be interpreted to embrace all such variations and modifications.

What is claimed is:

1. A flash memory interface comprising:
a flash memory controller configured to communicate with one or more flash memory devices;
a data buffer configured to store write data for the one or more flash memory devices; and
a data scramble unit configured to modify the write data to generate scrambled data to be written to the one or more flash memory devices, wherein the data scramble unit includes a first circuit coupled to receive, as an input, at least a portion of an address identifying a location in the one or more flash memory devices to which the scrambled data is to be written, wherein the data scramble unit is configured to perform a logic operation on the input to generate a seed, and wherein the data scramble unit further includes a pseudo-random number generator coupled to receive the seed and to generate a series of pseudo-random numbers from the seed, and wherein the data scramble unit is configured to generate the scrambled data responsive to the series of pseudo-random numbers and the write data from the data buffer, and wherein the data scramble unit is configured to transmit the scrambled data to the flash memory controller, and wherein the portion of the address comprises a least significant portion, and wherein the input to the first circuit is a width that is an integer multiple of a width of the least significant portion of the address, and wherein the first circuit is coupled to receive the least significant portion a plurality of times within the width of the input.

2. The flash memory interface unit as recited in claim 1 wherein the data scramble unit is further configured to receive scrambled read data from the flash memory controller, and wherein the data scramble unit is configured to descramble the scrambled read data to recover the read data responsive to at least a portion of a read address provided to read the data.

3. The flash memory interface unit as recited in claim 2 wherein the first circuit is configured to generate the seed responsive to at least a portion of the read address, and wherein the pseudo-random number generator is configured to generate the series of pseudo-random numbers responsive to the seed, and wherein the seed and the series of pseudo-random numbers are the same as corresponding values generated when the scrambled read data was written to the one or more flash memory devices.

4. The flash memory interface unit as recited in claim 1 wherein the first circuit comprises a cyclic-redundancy check (CRC) generator configured to generate a CRC value from the input.

5. The flash memory interface unit as recited in claim 4 wherein the CRC value is larger than the seed, and wherein the random number generator is coupled to receive a portion of the CRC value as the seed.

6. The flash memory interface unit as recited in claim 5 wherein the portion of the CRC value comprises a least significant portion of the CRC value.

7. The flash memory interface unit as recited in claim 1 wherein the first circuit is configured to complement the least significant portion of the address in at least one of the plurality times that the least significant portion of the address is used to create the input.

8. The flash memory interface unit as recited in claim 1 wherein the pseudo-random number generator comprises a linear feedback shift register (LFSR).

9. A method comprising:
receiving, as an input to a data scramble unit, at least a portion of an address of a memory operation for a memory;
generating, by the data scramble unit, a seed responsive to the input;
generating, by the data scramble unit, a plurality of data values responsive to the seed;
receiving data corresponding to the memory operation in the data scramble unit; and
scrambling the data using the plurality of data values;
wherein generating a plurality of data values comprises:
generating a first value of the plurality of data values using the seed; and
generating the second value of the plurality of data values using the first value;
and wherein scrambling the data comprises:
scrambling first data with the data using the first value prior to generating the second value; and
scrambling second data within the data using the second value.

10. The method as recited in claim 9 wherein each of the first data and the second data has a width that is equal to a width of a data transfer to the memory.

11. The method as recited in claim 9 further comprising writing the scrambled data to the memory.

12. The method as recited in claim 9 further comprising providing the result of the scrambling as read data, wherein the received data is scrambled data that was previously written to the memory.

13. An apparatus comprising:
a cyclical redundancy check (CRC) circuit coupled to receive a least significant portion of a write address corresponding to a write operation for a memory, wherein the CRC circuit is configured to generate a CRC value responsive to the least significant portion of the write address;
a linear feedback shift register (LFSR) coupled to receive a least significant portion of the CRC value as a seed; and
a logic circuit coupled to receive write data corresponding to the write address and LFSR data from the LFSR, the logic circuit configured to logically combine the write data and the LFSR data to provide data to be written to the memory.

14. The apparatus as recited in claim 13 wherein the CRC circuit is coupled to receive a least significant portion of a read address corresponding to a read operation for the memory, wherein the CRC circuit is configured to generate the CRC value responsive to the least significant portion of the read address, and wherein the logic circuit is coupled to receive read data corresponding to the read address and is configured to logically combine the read data and the LFSR data to generate data to be returned to an initiator of the read operation.

15. The apparatus as recited in claim 13 wherein a width of the LFSR data is equal to a width of a data transfer with the memory, and wherein the logic circuit comprises a bit-wise exclusive OR.

16. The apparatus as recited in claim 13 further comprising advancing the LFSR to a next LFSR data responsive to using the LFSR data in the logic circuit, wherein the next LFSR data is used for next write data corresponding to the write operation.

17. The apparatus as recited in claim 13 wherein the CRC circuit is configured to operate on an input value that is larger than the least significant portion of the address, wherein the CRC circuit is configured to replicate the least significant portion to fill the input value.

18. The apparatus as recited in claim 17 wherein the CRC circuit is further configured to invert at least one of the replicas of the least significant portion to generate the input value.

19. An integrated circuit comprising:
a processor configured to generate one or more commands to open a page of memory;
a memory interface unit coupled to receive the one or more commands and configured to open the page, wherein the memory interface unit comprises a data scramble unit configured to scramble data transferred between the memory and the memory interface unit, wherein the memory interface unit is configured to initialize the data scramble unit responsive to opening the page, wherein the memory interface unit is configured to initialize the data scramble unit responsive to at least a portion of the address, wherein the data scramble unit comprises a first circuit coupled to receive at least a portion of an address of the page and configured to generate a seed responsive to the portion, and wherein the data scramble unit further comprises a pseudo-random number generator coupled to receive the seed and configured to generate one or more values to be combined with the data transferred between the memory and the memory interface unit, and wherein each value of the one or more value is used for a different cycle of data transfer, and wherein multiple cycles of data transfer are used to transfer the page, wherein the pseudo-random number generator is configured to advance to the next value responsive to using a current value for a transfer of data.

20. The integrated circuit as recited in claim 19 wherein each value has a width equal to a width of the cycle of data transfer.

21. The integrated circuit as recited in claim 20 wherein the first circuit is configured to generate an output that is wider than the seed, and wherein the seed is the least significant portion of the output.

22. An integrated circuit comprising:
   a processor configured to generate one or more commands to open a page of memory;
   a memory interface unit coupled to receive the one or more commands and configured to open the page, wherein the memory interface unit comprises a data scramble unit configured to scramble data transferred between the memory and the memory interface unit, wherein the memory interface unit is configured to initialize the data scramble unit responsive to opening the page, wherein the memory interface unit is configured to initialize the data scramble unit responsive to at least a portion of the address, wherein the data scramble unit comprises a first circuit coupled to receive at least a portion of an address of the page and configured to generate a seed responsive to the portion, and wherein the data scramble unit further comprises a pseudo-random number generator coupled to receive the seed and configured to generate one or more values to be combined with the data transferred between the memory and the memory interface unit, and wherein the memory interface unit is configured to generate generating an input to the first circuit responsive to the portion of the address and a complement of the portion.

\* \* \* \* \*

UNITED STATES PATENT AND TRADEMARK OFFICE
CERTIFICATE OF CORRECTION

PATENT NO. : 8,402,349 B2
APPLICATION NO. : 12/961272
DATED : March 19, 2013
INVENTOR(S) : Douglas C. Lee et al.

Page 1 of 1

It is certified that error appears in the above-identified patent and that said Letters Patent is hereby corrected as shown below:

In the Claims:

Claim 22, Column 16, Line 11, delete "generating"

Signed and Sealed this
Eleventh Day of June, 2013

Teresa Stanek Rea
*Acting Director of the United States Patent and Trademark Office*